(12) United States Patent
Pedersen

(10) Patent No.: US 8,381,068 B1
(45) Date of Patent: Feb. 19, 2013

(54) PARTIAL RECONFIGURATION AND ERROR DETECTION IN AN INTEGRATED CIRCUIT

(75) Inventor: Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 315 days.

(21) Appl. No.: 12/870,607

(22) Filed: Aug. 27, 2010

(51) Int. Cl.
*H03M 13/00* (2006.01)

(52) U.S. Cl. ........................ 714/758; 714/773

(58) Field of Classification Search .............. 714/773, 714/758
See application file for complete search history.

(56) References Cited

U.S. PATENT DOCUMENTS

| 6,438,724 B1 * | 8/2002 | Cox et al. ............ 714/758 |
| 6,446,234 B1 * | 9/2002 | Cox et al. ............ 714/758 |
| 2009/0086551 A1 * | 4/2009 | Ide et al. ............ 365/189.03 |

* cited by examiner

*Primary Examiner* — M. Mujtaba K Chaudry
(74) *Attorney, Agent, or Firm* — Womble Carlyle Sandridge & Rice, LLP

(57) ABSTRACT

Techniques for reconfiguring an integrated circuit (IC) are provided. The techniques may improve error detection in the partially reconfigurable IC. A cyclic redundancy check (CRC) value for a first configuration data is received by the IC and a second configuration data is generated based on the first configuration data and a prior configuration data stored in the IC. The first configuration data may be a partial reconfiguration data that is used to reconfigure at least a portion of the IC. A third configuration data is then generated based on the first and second configuration data and the prior configuration data. A second CRC value is calculated based on the third configuration data. The second CRC value, together with the first CRC value and a prior CRC value stored in the IC, is used to calculate an updated CRC value. The updated CRC value is stored in the IC.

7 Claims, 5 Drawing Sheets

PARTIAL RECONFIGURATION AND ERROR DETECTION IN AN INTEGRATED CIRCUIT

BACKGROUND

Programmable integrated circuits (ICs) such as field programmable gate arrays (FPGA) typically include different blocks to accommodate various logic functions and protocols. For instance, programmable ICs may have configurable elements that may be programmed or reprogrammed. These elements may be configured or programmed through configuration random access memory (CRAM) bits, registers, or other memory elements, among others.

However, CRAM bits are typically susceptible to single event upset (SEU) errors. SEU errors are unwanted changes or unwanted effects in IC devices. For example, the state of memory cells or CRAM bits may flip due to radiation or other external causes. Programmable ICs usually have error detection circuitry to detect erroneous settings in the CRAM circuitry that may have been caused by SEU events during configuration. The error detection circuitry usually computes or performs a cyclic redundancy check (CRC) operation on all or a portion of the CRAM circuitry. The CRC may be calculated for each frame of the CRAM array or it may be calculated for all the CRAM bits in the CRAM array.

Generally speaking, programmable ICs, e.g., FPGAs, may be partially reconfigured. In other words, only a portion of the IC's configuration RAM (CRAM) is changed when the IC is reconfigured. The portion of the CRAM that is not reconfigured remains unchanged. This is usually done by performing a logic operation on the existing CRAM values stored in the IC with the reconfiguration CRAM values that are received by the IC to generate a new configuration data. In other words, existing CRAM values stored in the IC are combined with the reconfiguration CRAM values to generate an updated array of CRAM values.

Typically, the new CRC value is calculated dynamically based on the updated CRAM bits. However, if there was a read-back error such that the logic operation to combine the existing CRAM values with the reconfiguration CRAM values was performed using a wrong value of the existing CRAM bits, then the resulting CRAM bits from the logic operation would be incorrect. Likewise, if there was a configuration error, the logic operation would combine the existing CRAM values with the wrong reconfiguration CRAM values and generate incorrect updated CRAM bits.

In these instances, an incorrect CRC value will be calculated because the CRC value is calculated dynamically based on the CRAM bits. The error detection circuitry on the IC that is used to detect erroneous CRAM settings will not be able to detect the error because the generated CRC value matches the incorrect CRAM bits.

As such, it would be desirable to correctly calculate a new CRC value based on the updated CRAM values. It is within this context that the invention arises.

SUMMARY

Embodiments of the present invention include techniques and circuits for detecting errors in a partially reconfigured integrated circuit (IC).

It should be appreciated that the present invention can be implemented in numerous ways, such as a process an apparatus, a system, a device or a method on a computer readable medium. Several inventive embodiments of the present invention are described below.

In one embodiment, a method of reconfiguring an IC is disclosed. The method includes receiving a first cyclic redundancy check (CRC) value based on a first configuration data. In an exemplary embodiment, the first configuration data is a partial reconfiguration data that is used to partially reconfigure the IC. A second configuration data is generated based on the first configuration data and a prior configuration data stored in the IC. According to one embodiment, the second configuration data is an updated configuration data for the IC. A third configuration data is then generated using the first, second and prior configuration data. A second CRC value is calculated based on the third configuration data. An updated CRC value for the updated configuration data is calculated based on a prior CRC value stored in the IC, the first CRC value received by the IC, and the second CRC value that was calculated based on the third configuration data. The updated CRC value is stored in the IC.

In another embodiment a method of partially reconfiguring an IC is provided. The method includes receiving an error checking value and a partial reconfiguration data where a portion of the partial reconfiguration data bits is similar to a prior configuration data stored in the IC. A first logic operation is then performed on the partial reconfiguration data and the prior configuration data to generate an updated configuration data. A second logic operation is performed on the prior configuration data, the partial reconfiguration data and the updated configuration data to generate a temporary configuration data. A temporary error checking value is calculated for this temporary configuration data. A third logic operation is performed on the error checking value that was received by the IC, the temporary error checking value and a prior error checking value stored in the IC to generate an updated error checking value. The updated error checking value is stored in the IC, replacing the prior error checking value.

In yet another embodiment, an IC is disclosed. The IC has a first logical operator circuit that is coupled to receive a partial reconfiguration data. A storage unit that holds a prior configuration data is coupled to the first logical operator circuit. The first logical circuit outputs an updated configuration data based on a combination of the partial reconfiguration data and the prior configuration data. A second logical operator circuit is coupled to the first logical operator circuit to receive the updated configuration data. The second logical operator circuit outputs a temporary configuration data based on the updated configuration data, the prior configuration data and the partial reconfiguration data. A CRC generator circuit is coupled to the second logical operator circuit to generate a CRC value based on the temporary configuration data from the second logical operator circuit. A third logical operator circuit is coupled to receive the CRC value from the CRC generator circuit and a CRC value that is calculated based on the partial reconfiguration data. The third logical operator circuit generates an updated CRC value based on the CRC value received, the output from the CRC generator circuit and a prior CRC value stored in the IC.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DETAILED DESCRIPTION

The following embodiments describe techniques and circuits for detecting errors in a partially reconfigured integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide techniques to calculate a cyclic redundancy check (CRC) value of a configuration bit stream data prior to loading the configuration bit stream data to a programmable IC. It should be appreciated that this CRC value may be calculated for each frame of the configuration bit stream data or for the whole bit stream. One of the embodiments describes a method for generating or calculating a CRC value for a partially reconfigured IC. For instance, the IC with a first set of configuration data may be loaded with an updated set of configuration data, or a partial reconfiguration bit stream data. The partial reconfiguration bit stream data changes only a portion of the original configuration data in the IC. In other words, not every bit of the original configuration data in the IC is changed. According to one embodiment, a CRC value is pre-calculated based solely on the partial reconfiguration bit stream data and is loaded into the IC together with the partial reconfiguration bit stream data before an updated CRC value is generated based on the combination of the original configuration data and the partial reconfiguration bit stream data.

Figure 1:
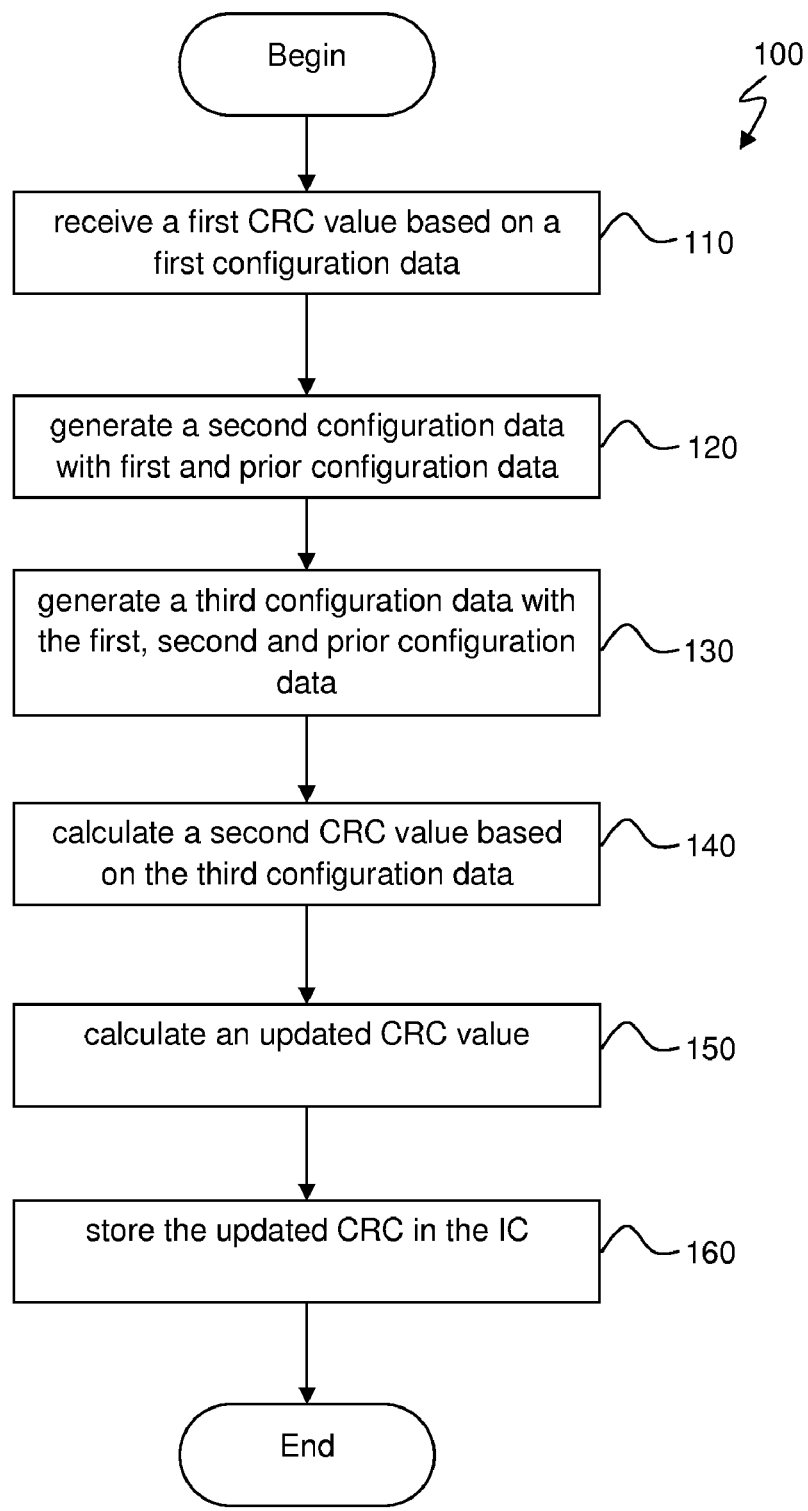
FIG. 1, meant to be illustrative and not limiting, shows a simplified method flow for reconfiguring an IC as one embodiment in accordance with the present invention.

FIG. 1, meant to be illustrative and not limiting, shows simplified method flow 100 for reconfiguring an IC as one embodiment in accordance with the present invention. Flow 100 begins with the IC receiving a first CRC value based on a first configuration data in operation 110. In the embodiment of FIG. 1, the first configuration data is a partial reconfiguration data for the IC. The partial reconfiguration data may share similar bits with a prior configuration stored in the IC. According to one embodiment, the portion of the partial reconfiguration data that is similar to the prior configuration data is set to 0. In other words, bits that do not change appear as 0 in the partial reconfiguration data stream. A second configuration data is generated by the IC in operation 120. The second configuration data is generated based on the first configuration data received in operation 110 and the prior configuration data stored in the IC. According to one embodiment, the prior configuration data is stored in a CRAM array in the IC.

Continuing from FIG. 1, a third configuration data is then generated in operation 130. This third configuration data is generated based on the first and second configuration data and the prior configuration data. In one embodiment, the third configuration data is generated by performing a logic operation, e.g., an XOR operation, on the first, second and the prior configuration data. In operation 140, a second CRC value is calculated based on the third configuration data in operation 130. An updated CRC value is calculated in operation 150 based on the first CRC value, the second CRC value generated in operation 140, and a prior CRC value stored in the IC. According to one embodiment, the updated CRC value is obtained by performing an XOR operation on the first CRC value, the second CRC value and the prior CRC value stored in the IC. In operation 160, this updated CRC value is then stored in the IC, replacing the prior CRC value. The updated CRC value is used to match the updated configuration data in the IC. According to one embodiment, the updated configuration data is a combination of the partial reconfiguration data and the prior configuration data stored in the IC. In the embodiment of FIG. 1, the second configuration data generated in operation 120 is an updated configuration data that is generated by combining the partial reconfiguration data with the prior configuration data in the IC.

Figure 2:
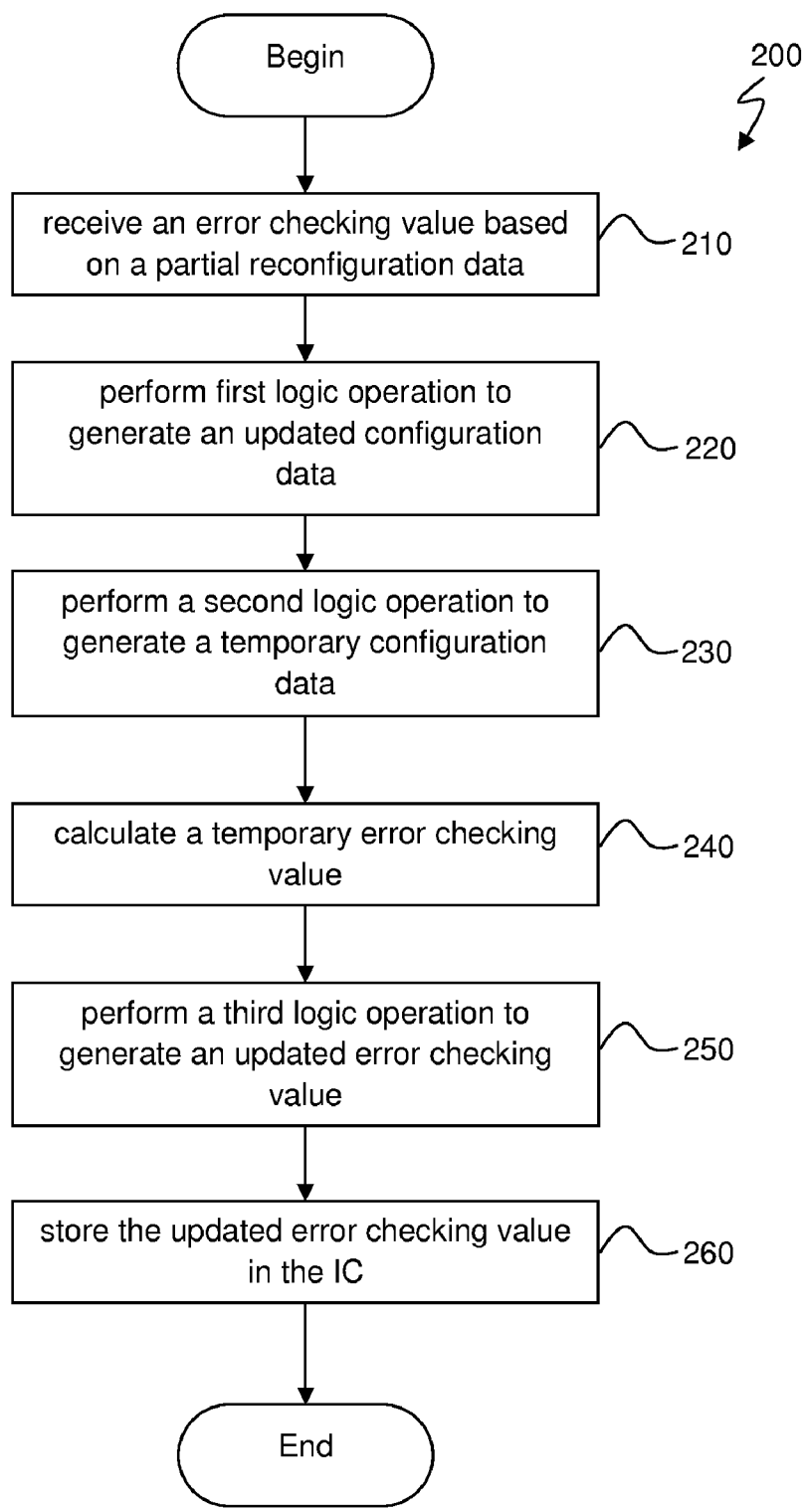
FIG. 2, meant to be illustrative and not limiting, shows a method flow for partially reconfiguring an IC as one embodiment in accordance with the present invention.

FIG. 2, meant to be illustrative and not limiting, shows method flow 200 for partially reconfiguring an IC as one embodiment in accordance with the present invention. Method 200 begins by receiving an error checking value and a partial reconfiguration data in operation 210. According to one embodiment, the error checking value is a CRC value for the partial reconfiguration data. In an exemplary embodiment, the CRC is calculated solely based on the partial reconfiguration data. In operation 220, a first logic operation is performed on the partial reconfiguration data and a prior configuration data stored in the IC to generate an updated configuration data. In one embodiment, the partial reconfiguration data is combined with the prior configuration data with an OR operation to generate an updated configuration data for the IC.

Referring still to FIG. 2, a second logic operation is performed on the prior configuration data, the partial reconfiguration data and the updated configuration data to generate a temporary configuration data in operation 230. In one embodiment, the bits in the three configuration data, i.e., the prior, partial and updated configuration data, are XOR-ed to generate a temporary configuration data. A temporary error checking value, e.g., a CRC value, for the temporary configuration data is calculated in operation 240. In operation 250, a third logic operation is performed on the error checking value received in operation 210, the temporary error checking value calculated in operation 240 and a prior error checking value stored in the IC. The resulting value in operation 250 is an updated error checking value, e.g., a CRC value, for the updated configuration data. This updated error checking value is stored in the IC in operation 260, replacing the prior error checking value that was stored in the IC. The updated error checking value can be used to check that the updated configuration data is valid.

Figure 3:
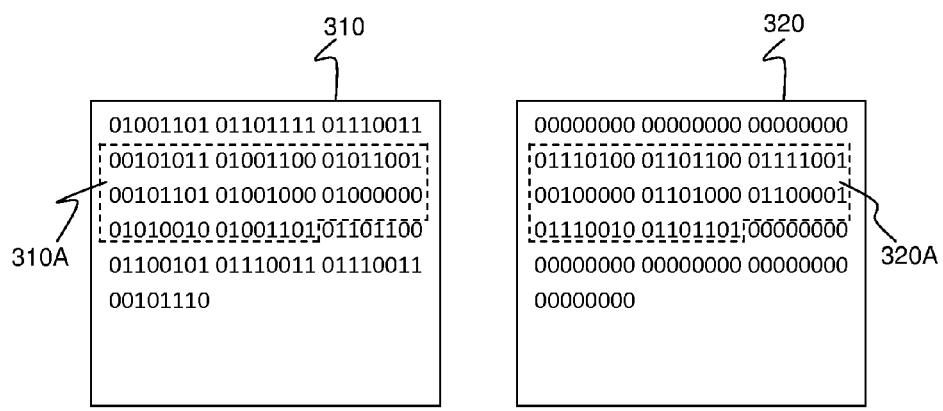
FIG. 3, meant to be illustrative and not limiting, shows a representation of a configuration bit stream as on embodiment in accordance with the present invention.

FIG. 3, meant to be illustrative and not limiting, shows a representation of a configuration bit stream as one embodiment in accordance with the present invention. In the embodiment of FIG. 3, bit stream 310 is a prior configuration data that is stored in an IC and bit stream 320 is a partial reconfiguration data that is used to partially reconfigure the IC. It should be appreciated that not every single bit of data will be changed in a partial reconfiguration. Therefore, typically, only a portion of the bits will be different in the partial reconfiguration data. The portion of bit stream 310 that is being reconfigured is enclosed in dotted-line area 310A in FIG. 3. Bits that remain unchanged are set to 0 in partial reconfiguration bit stream 320. The portion of bit stream 320 that differs from bit stream 310 is enclosed in dotted-line area 320A. In the embodiments of FIGS. 1 and 2, such a partial reconfiguration data is received by the IC in operations 110 and 210, respectively.

Figure 4:
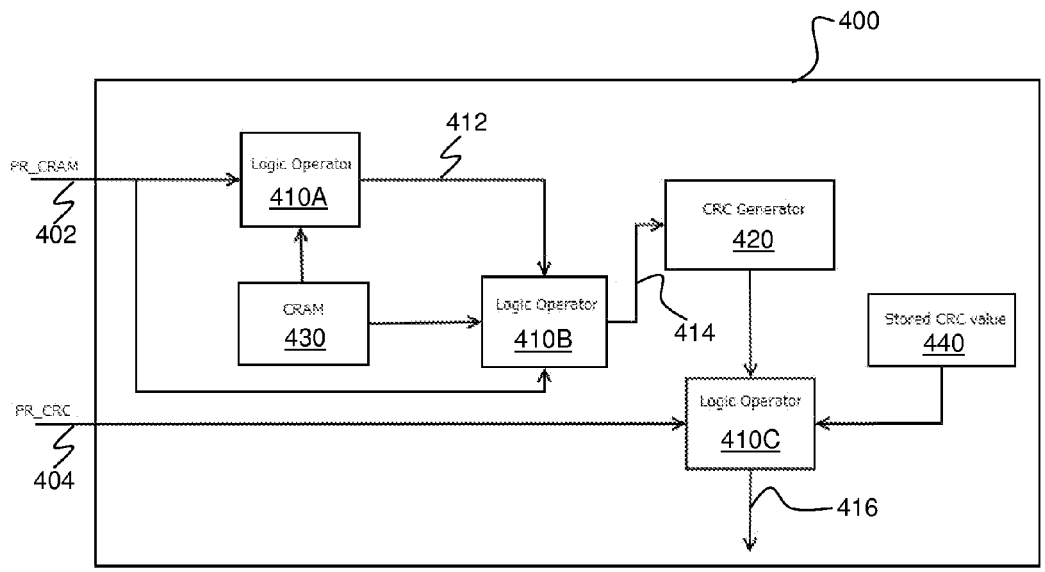
FIG. 4, meant to be illustrative and not limiting, is a simplified block diagram showing elements in an IC as one embodiment in accordance with the present invention.

FIG. 4, meant to be illustrative and not limiting, is a simplified block diagram 400 showing elements in an IC as one embodiment in accordance with the present invention. The IC receives a partial reconfiguration data, PR_CRAM, at input 402 and a CRC based on the partial reconfiguration data, PR_CRC, at input 404. In the embodiment of FIG. 4, PR_CRAM and PR_CRC are generated by an external source. For example, the partial reconfiguration data, PR_CRAM, is generated by a computer application, e.g., an electronic design automation (EDA) application and the CRC value, PR_CRC, is calculated by the application based on the PR_CRAM value. It should be appreciated that the CRC value may be calculated per "frame" of the partial reconfiguration data or there may be a single CRC value for the entire partial reconfiguration data bit stream.

Referring still to FIG. 4, PR_CRAM, received at input 402, is sent to a first logic operator circuit 410A. Logic operator circuit 410A is coupled to a memory array 430, e.g., CRAM array. In the embodiment of FIG. 4, CRAM array 430 stores a prior configuration data that is used to configure the IC. Logic operator circuit 410A generates output 412 based on both the prior configuration data from CRAM array 430 and PR_CRAM. In one embodiment, logic operator circuit 410A combines PR_CRAM with the prior configuration data from CRAM array 430 to generate an updated configuration data bit stream. The updated configuration data bit stream may then be stored in CRAM array 430, replacing the prior configuration data.

Continuing from FIG. 4, output 412 of the first logic operator circuit 410A is coupled to a second logic operator circuit 410B. Logic operator circuit 410B uses the output 412 from logic operator circuit 410A, the prior configuration data from CRAM array 430 and PR_CRAM received at input 402 to generate an output 414. In the embodiment of FIG. 2, output 414 is a temporary configuration data that is generated in operation 230. Output 414 is coupled to CRC generator block 420 in the embodiment of FIG. 4. CRC generator block generates a CRC value based on output 414 from logic operator circuit 410B.

Referring still to FIG. 4, the output from CRC generator block 420 is coupled to a third logic operator circuit 410C. Logic operator circuit 410C generates an updated CRC value at output 416 based on the temporary CRC value from CRC generator block 420, PR_CRC received at input 404 and a prior CRC value stored in storage unit 440. According to one embodiment, output 416 is coupled to an error detection circuit that compares the updated configuration data with the updated CRC value, details of which are omitted so as to not necessarily obscure the present invention. The updated CRC value may be stored in storage unit 440, replacing the prior CRC value. One skilled in the art should appreciate that the prior CRC value can be stored in a separate storage unit 440 or in CRAM array 430. It should also be appreciated that logic operator circuits 410A, 410B and 410C described herein may refer to any logic gates, e.g., OR, XOR, etc., or a combination of logic elements. In one embodiment, the first logic operator circuit 410A is an OR gate and the second and third logic operator circuits 410B and 410C are XOR gates.

Figure 5:
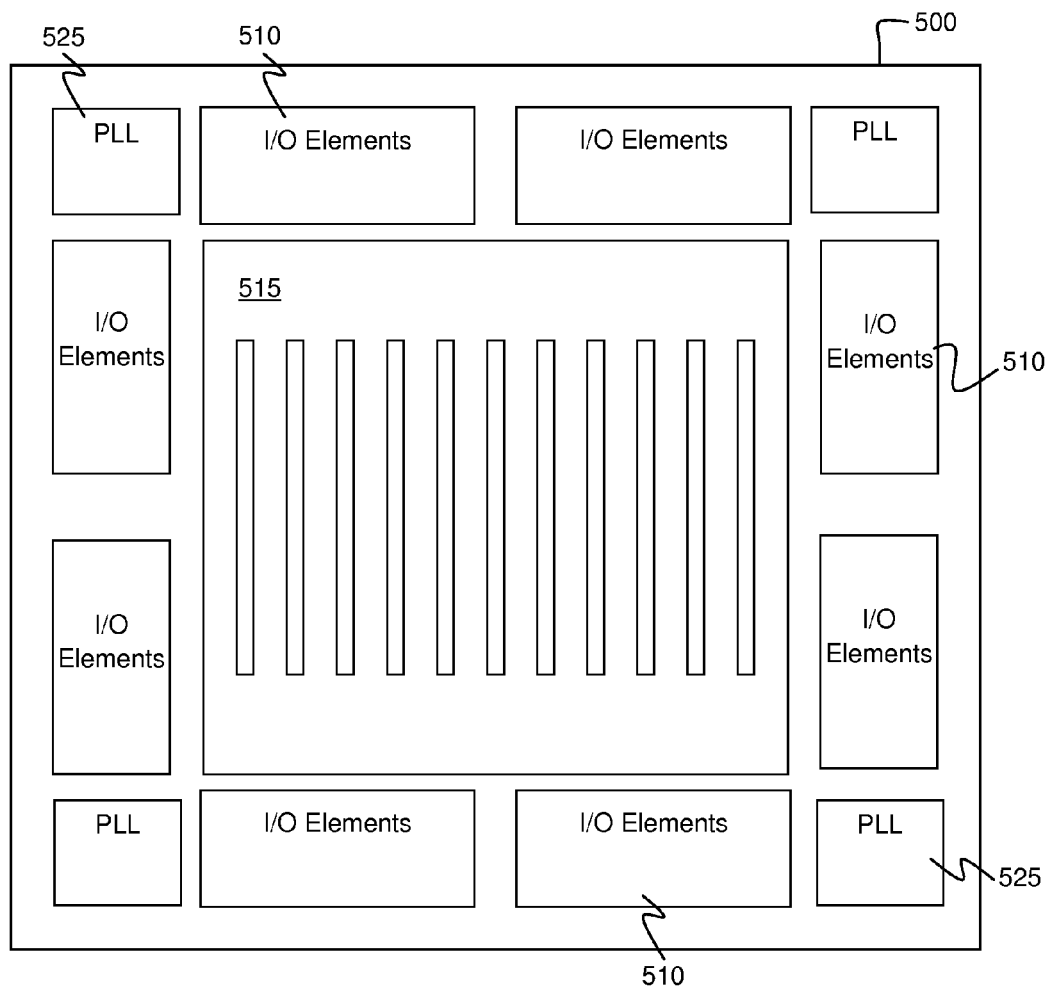
FIG. 5, meant to be illustrative and not limiting, shows a simplified block diagram of a PLD that can include aspects of the present invention.

FIG. 5, meant to be illustrative and not limiting, shows a simplified block diagram of PLD 500 that can include aspects of the present invention. Programmable device 500 includes core logic region 515 and I/O elements 510. I/O elements 510 may support a variety of memory interfaces. Other auxiliary circuits such as phase-locked loops (PLLs) 525 for clock generation and timing, can be located outside the core logic region 515, e.g., at corners of programmable device 500 and adjacent to I/O elements 510. Core logic region 515 may be populated with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. For instance, PLD 500 can be partially reconfigured and core logic region 515 includes circuitry to generate an updated CRC value similar to that shown in the embodiment of FIG. 4.

Figure 6:
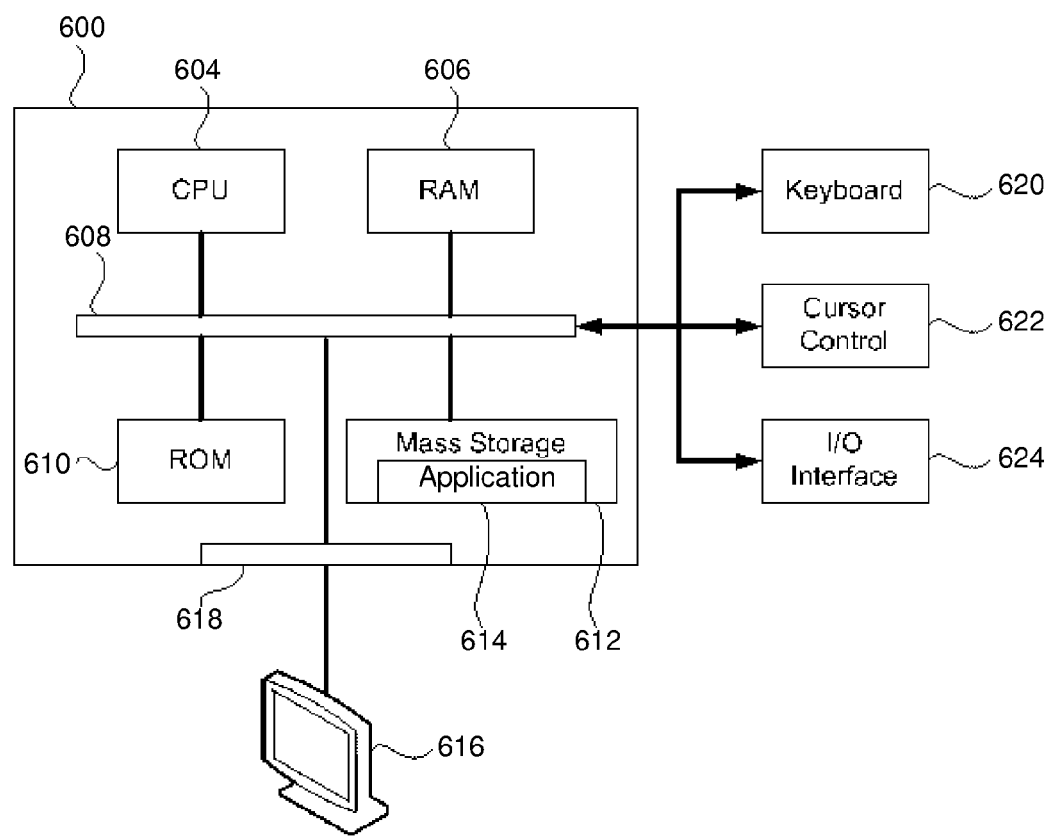
FIG. 6 is a simplified schematic diagram of a computer system for implementing embodiments of the present invention.

FIG. 6 is a simplified schematic diagram of a computer system 600 for implementing embodiments of the present invention. It should be appreciated that the methods described herein may be performed with a digital processing system, such as a conventional, general-purpose computer system. Special-purpose computers, which are designed or programmed to perform one function may be used in the alternative. In addition, the computer system of FIG. 6 may be used for the purpose of IC configuration and compilation. The computer system includes a central processing unit (CPU) 604, which is coupled through bus 608 to random access memory (RAM) 606, read-only memory (ROM) 610, and mass storage 612. Mass storage device 612 represents a persistent data storage device such as a floppy disc drive or a fixed disc drive, which may be local or remote. Application 614 resides in mass storage 612, but can also reside in RAM 606 during processing. According to one embodiment, application 614 is an EDA software that is used to configure IC devices that may include aspects of the present invention. For example, application 614 may be used to generate a partial reconfiguration data bit stream and a CRC value for an IC device as illustrated in the embodiment of FIG. 4. It should be appreciated that CPU 604 may be embodied in a general-purpose processor, a special-purpose processor, or a specially programmed logic device.

Referring still to FIG. 6, display 616 is in communication with CPU 604, RAM 606, ROM 610, and mass storage device 612, through bus 608 and display interface 618. Keyboard 620, cursor control 622, and interface 624 are coupled to bus 608 to communicate information in command selections to CPU 604. For example, according to one embodiment, normalization and scaling input can be received as a command received by an input device (such as a mouse or keyboard). This user input is then communicated to CPU 604. It should be appreciated that data to and from external devices may be communicated through interface 624.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of reconfiguring an integrated circuit (IC), comprising:
    receiving a first cyclic redundancy check (CRC) value based on a first configuration data;
    generating a second configuration data based on the first configuration data and a prior configuration data stored in the IC;
    generating a third configuration data based on the first and second configuration data and the prior configuration data;
    calculating a second CRC value based on the third configuration data;
    calculating an updated CRC value based on the first CRC value, a prior CRC value stored in the IC and the second CRC value; and
    storing the updated CRC in the IC.

2. The method of claim 1, wherein the first configuration data is a partial reconfiguration data for reconfiguring the IC.

3. The method of claim 2, further comprising:
    combining the partial reconfiguration data with the prior configuration data to generate an updated configuration data; and
    storing the updated configuration data in the IC, wherein the updated configuration data replaces the prior configuration data.

4. The method of claim 1, wherein at least a portion of bits in the first configuration data is similar to the prior configuration data, wherein the portion of bits that is similar to the prior configuration data is set to 0.

5. The method of claim 1, wherein the calculating the updated CRC value includes performing a logic operation on the first CRC value, the second CRC value and the prior CRC value.

6. The method of claim 5, wherein the logical operation is an XOR operation.

7. The method of claim 1, further comprising:
    comparing the updated CRC value with the second configuration data.

* * * * *